US 12,308,766 B2

(12) United States Patent
Ishikawa et al.

(10) Patent No.: US 12,308,766 B2
(45) Date of Patent: May 20, 2025

(54) MEASUREMENT SYSTEM AND DIAGNOSIS SYSTEM

(71) Applicant: Saginomiya Seisakusho, Inc., Tokyo (JP)

(72) Inventors: Takuro Ishikawa, Sayama (JP); Hisayuki Ashizawa, Sayama (JP); Hiroyuki Mitsuya, Sayama (JP)

(73) Assignee: Saginomiya Seisakusho, Inc., Tokyo (JP)

(*) Notice: Subject to any disclaimer, the term of this patent is extended or adjusted under 35 U.S.C. 154(b) by 411 days.

(21) Appl. No.: 17/777,949

(22) PCT Filed: Jan. 13, 2021

(86) PCT No.: PCT/JP2021/000778
§ 371 (c)(1),
(2) Date: May 18, 2022

(87) PCT Pub. No.: WO2021/153225
PCT Pub. Date: Aug. 5, 2021

(65) Prior Publication Data
US 2022/0416692 A1    Dec. 29, 2022

(30) Foreign Application Priority Data
Jan. 27, 2020    (JP) .................. 2020-011202

(51) Int. Cl.
*H02N 2/18* (2006.01)
*G01F 1/34* (2006.01)
(Continued)

(52) U.S. Cl.
CPC ............... *H02N 2/186* (2013.01); *G01F 1/34* (2013.01); *G01K 5/56* (2013.01);
(Continued)

(58) Field of Classification Search
CPC . H02N 2/186; G01F 1/34; G01K 5/56; G01R 19/16576; H04Q 9/00; H04Q 2209/40; H04Q 2209/886
See application file for complete search history.

(56) References Cited

U.S. PATENT DOCUMENTS 7,258,533 B2 * 8/2007 Tanner .................. F04B 43/046
417/505
2007/0114422 A1    5/2007 Berkcan et al.
(Continued)

FOREIGN PATENT DOCUMENTS

JP    2005-300424 A    10/2005
JP    2006-126155 A    5/2006
(Continued)

OTHER PUBLICATIONS

Written Opinion dated Mar. 23, 2021, issued in PCT Application No. PCT/JP2021/000778, filed Jan. 13, 2021.
(Continued)

*Primary Examiner* — Stephen D Meier
*Assistant Examiner* — Leo T Hinze
(74) *Attorney, Agent, or Firm* — Workman Nydegger

(57) ABSTRACT

A measurement system includes a vibration generation unit that generates sound or vibration in response to a change in environmental state quantity, a vibration-driven energy harvesting unit that generates electric power using the sound or vibration generated by the vibration generation unit, and a transmission unit that is driven with the electric power generated by the vibration-driven energy harvesting unit and transmits predetermined information.

11 Claims, 9 Drawing Sheets

(51) Int. Cl.
*G01K 5/56* (2006.01)
*G01R 19/165* (2006.01)
*H04Q 9/00* (2006.01)

(52) U.S. Cl.
CPC ......... *G01R 19/16576* (2013.01); *H04Q 9/00* (2013.01); *H04Q 2209/40* (2013.01); *H04Q 2209/886* (2013.01)

(56) References Cited

U.S. PATENT DOCUMENTS

| | | |
|---|---|---|
| 2012/0091859 A1 | 4/2012 | Ono et al. |
| 2012/0176000 A1 | 7/2012 | Mitchell et al. |
| 2016/0079886 A1 | 3/2016 | Hasegawa et al. |
| 2021/0123812 A1 | 4/2021 | Kamihara et al. |

FOREIGN PATENT DOCUMENTS

| | | |
|---|---|---|
| JP | 2012-085456 A | 4/2012 |
| JP | 2016-208067 A | 12/2016 |
| JP | 2018-190053 A | 11/2018 |
| JP | 2019-061545 A | 4/2019 |
| WO | 2015/039103 A1 | 3/2015 |
| WO | 2015/087956 A1 | 6/2015 |

OTHER PUBLICATIONS

Japanese Office Action dated May 18, 2022, issued in Japanese Application No. 2020-011202.
European Search Report dated Oct. 24, 2023, issued in EP Application No. 21747607.6.
Communication Pursuant to Article 94(3) EPC dated Jun. 19, 2024, issued in EP Application No. 21747607.6.

* cited by examiner

MEASUREMENT SYSTEM AND DIAGNOSIS SYSTEM

TECHNICAL FIELD

The present invention relates to a measurement system and a diagnosis system.

BACKGROUND ART

A system for monitoring devices such as social infrastructure without human intervention to transmit the monitoring result using wireless communication or the like is proposed. In a conventional system, in order to reduce power consumption, power consumption is reduced in a standby state where monitoring is not performed as compared with an operation state where monitoring is performed, thereby saving power (see Patent Literature 1).

CITATION LIST

Patent Literature

Patent Literature 1: Japanese Patent Laid-Open No. 2016-208067

SUMMARY OF INVENTION

Technical Problem

In a terminal device in a system in Patent Literature 1, an operation state and a standby state with low power consumption are switched in order to reduce power. However, since switching from the standby state to the operation state is performed based on an input signal acquired from an object to be monitored, power required to receive the input signal is always consumed even in the standby state with low power consumption. Thus, the power consumption in the standby state cannot be sufficiently reduced.

Solution to Problem

According to a first aspect, a measurement system includes a vibration generation unit that generates sound or vibration in response to a change in environmental state quantity, a vibration-driven energy harvesting unit that generates electric power using the sound or vibration generated by the vibration generation unit, and a transmission unit that is driven with the electric power generated by the vibration-driven energy harvesting unit and transmits predetermined information.

According to a second aspect, a diagnosis system includes the measurement system of the first aspect arranged near an object to be diagnosed and a reception system for receiving a signal transmitted from the measurement system and diagnosing a state of the object to be diagnosed based on the signal.

Advantageous Effects of Invention

According to the present invention, the power consumption of the measurement system can be significantly reduced.

DESCRIPTION OF EMBODIMENTS

Measurement System of One Embodiment

Hereinafter, a measurement system 1 of a first embodiment will be described with reference to FIG. 1.

Figure 1:
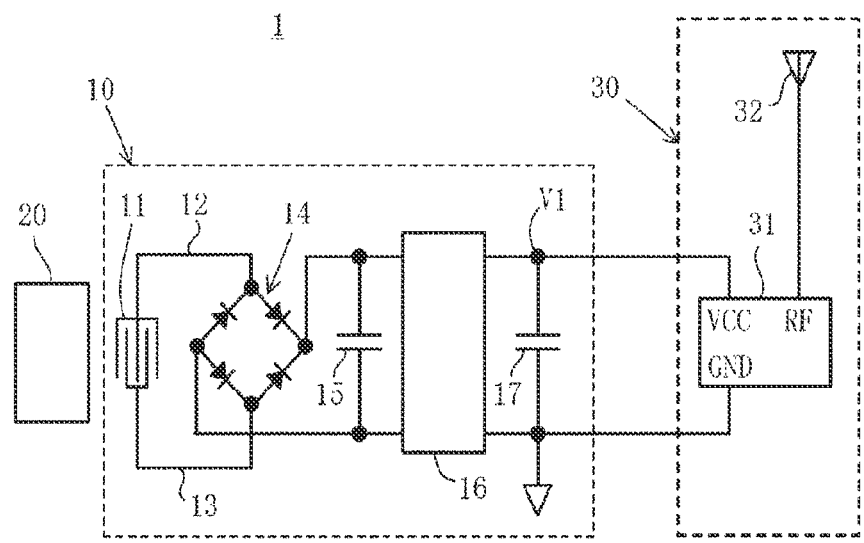
FIG. 1 is a diagram showing a schematic configuration of a measurement system of a first embodiment.

FIG. 1 is a diagram showing a schematic configuration of the measurement system 1 of the first embodiment. The measurement system 1 includes a vibration generation unit 20 that generates sound or vibration in response to a change in environmental state quantity such as temperature, pressure, and flow rate, a vibration-driven energy harvesting unit 10 that generates electric power using the sound or vibration generated by the vibration generation unit 20, and a transmission unit 30 that transmits predetermined information. FIG. 1 shows the vibration-driven energy harvesting unit 10 and the transmission unit 30, each surrounded by a broken line.

The vibration-driven energy harvesting unit 10 includes a vibration-driven energy harvesting element 11 which is an electret energy harvesting element, a piezo energy harvesting element, an electromagnetic induction energy harvesting element, or a magnetostriction energy harvesting element. The vibration-driven energy harvesting element 11 generates AC power having a frequency equal to the frequency of sound or vibration. The electric power generated by the vibration-driven energy harvesting element 11 is conveyed through connection wirings 12, 13 to a full-wave rectifying rectification circuit 14 including four rectifier elements as an example, rectified by the rectification circuit 14, and stored in a capacitor 15. Then, the electric power is converted into a predetermined voltage by a voltage converter (DC/DC converter) 16 and a power storage unit 17 including a capacitor or a storage battery is charged with the electric power.

The rectification circuit 14 is not limited to the full-wave rectifying one but may be a half-wave rectifying one.

One example is that one end (lower end in FIG. 1) of the power storage unit 17 is connected to the ground. Hereinafter, a voltage at the other end (upper end in FIG. 1) of the power storage unit 17 will be referred to as an output voltage V1.

The output voltage V1 based on the electric power generated by the vibration-driven energy harvesting unit 10 is input into a VCC terminal which is a power supply terminal of a communication circuit 31 constituting the transmission unit 30. One example is that the communication circuit 31 is a communication circuit including an amplification element such as a transistor, a vibrator element, and a frequency selection filter element such as a SAW device. An RF terminal of the communication circuit 31 is connected to an antenna 32 and a GND terminal is connected to the ground.

The communication circuit 31 is activated when a voltage higher than a first voltage which is a reference voltage is input into the VCC terminal and, as an example, outputs a high frequency signal including an identification signal unique to the measurement system 1 from the RF terminal to the antenna 32. That is, a signal including a unique identification signal is transmitted from the antenna 32 to the outside as a radio wave. The identification signal may be one obtained by making information on numbers into a signal or making information on alphabetical letters into a signal.

Although a configuration of the vibration generation unit 20 will be described later in detail, the vibration generation unit 20 generates sound or vibration when an environmental state quantity such as temperature, pressure, and flow rate substantially reaches a predetermined value. Using the sound or vibration generated at that time, the vibration-driven energy harvesting unit 10 including the vibration-driven energy harvesting element 11 generates electric power, and the output voltage V1 of the vibration-driven energy harvesting unit 10 rises to a voltage higher than the first voltage described above. As a result, the communication circuit 31 is activated and a signal including the identification signal unique to the measurement system 1 is transmitted from the antenna 32 to the outside as a radio wave.

On the other hand, in a case where the environmental state quantity such as temperature, pressure, and flow rate does not reach the predetermined value described above, the vibration generation unit 20 does not generate sound or vibration, and the vibration-driven energy harvesting unit 10 does not generate electric power. Alternatively, even in a case where the vibration-driven energy harvesting unit 10 generates electric power using sound or vibration existing in the environment, the amount of generated power is small. Thus, even the voltage converter 16 cannot increase the output voltage V1 to the first voltage described above to activate the communication circuit 31. Therefore, a radio wave including the identification signal unique to the measurement system 1 is not transmitted from the antenna 32 to the outside.

Accordingly, a reception system 80 of the outside shown in FIG. 9, which will be described later, can detect that the environmental state quantity such as temperature, pressure, and flow rate measured by the measurement system 1 has substantially reached the predetermined value by detecting the signal (radio wave) transmitted from the measurement system 1.

Incidentally, the signal transmitted from the transmission unit 30 is not limited to a radio signal transmitted via radio waves but may be an electric signal transmitted via a wire or a signal transmitted via light.

Although FIG. 1 shows an example in which the vibration generation unit 20 and the vibration-driven energy harvesting unit 10 are separated, at least a portion of the vibration-driven energy harvesting unit 10 may be included in the vibration generation unit 20 as described later. On the contrary, at least a portion of the vibration generation unit 20 may be included in the vibration-driven energy harvesting unit 10.

First Example of the Vibration Generation Unit

Figure 2:
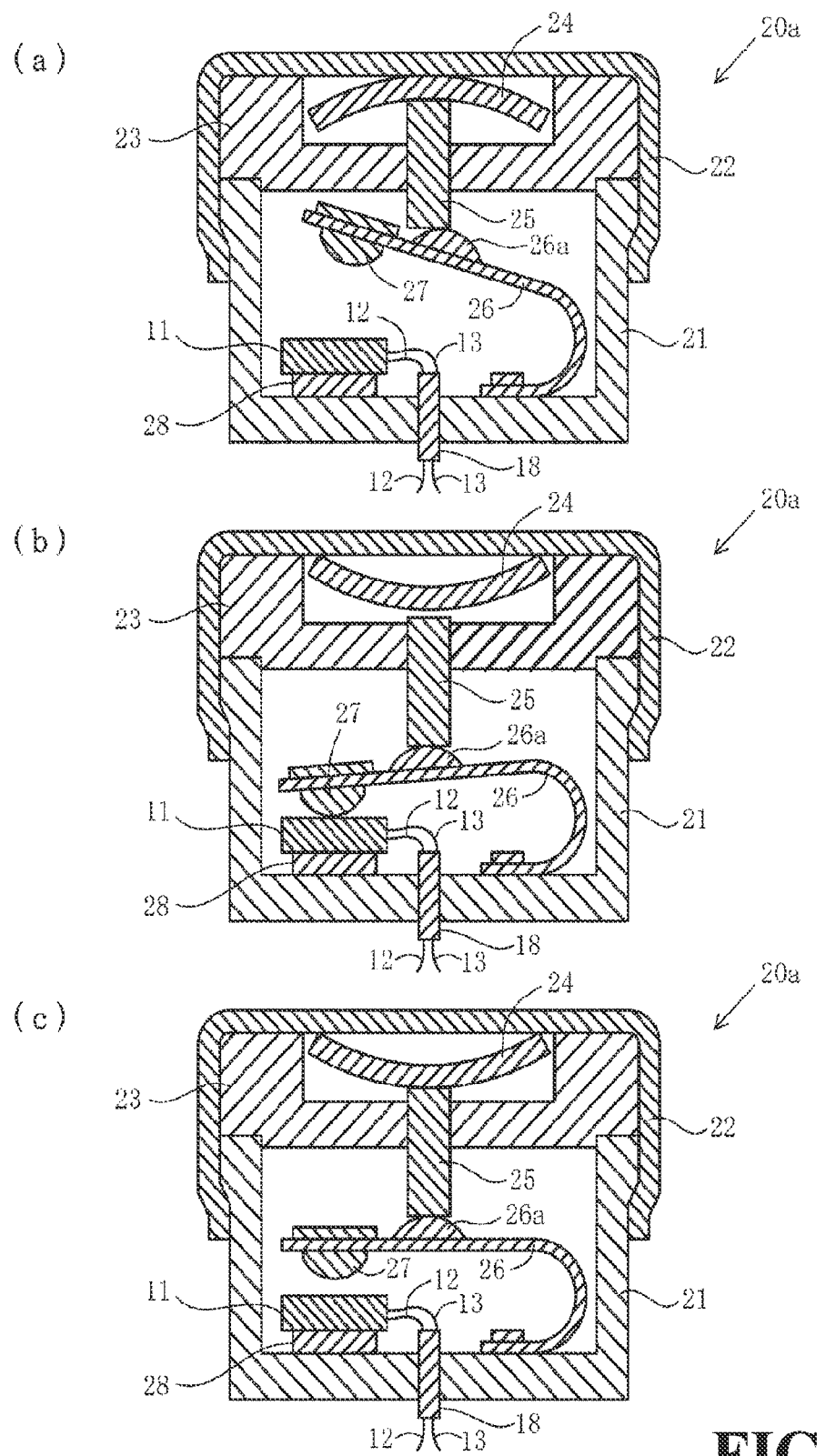
FIG. 2 is a diagram showing a first example of a vibration generation unit.

A vibration generation unit 20a, which is a first example of the vibration generation unit 20, will be described with reference to FIG. 2. In the first example shown in FIG. 2, the vibration-driven energy harvesting element 11 of the vibration generation unit 10 is arranged inside the vibration generation unit 20a.

The vibration generation unit 20a has a housing including a case 21, a cap 22, a guide 23, and the like and, in the housing, has the vibration-driven energy harvesting element 11 and a disk-shaped bimetal (bimetal disc) 24 as an example of a member whose shape changes due to a temperature change to generate sound or vibration. The bimetal 24 is, as an example, made by laminating two types of metal plates with different linear expansion rates, at least one metal plate of which has relatively high rigidity. The bimetal 24 is installed in a cavity formed by the cap 22 and the guide 23.

FIG. 2(a) shows the vibration generation unit 20a in a state where the temperature is relatively low. At this time, the shape of the bimetal 24 is an upwardly convex curved shape in FIG. 2(a) (a first shape in the first example). An actuation pin 25 is arranged so as to penetrate a through hole (not shown) provided in the guide 23. One end of the actuation pin 25 is in contact with a substantial center of the bimetal 24, and the other end is in contact with a pressing unit 26a of a spring member 26. The lower end of the spring member 26 is fixed to the case 21 and the elastic force of the spring member 26 causes the pressing unit 26a of the spring member 26 to push up the actuation pin 25 upward.

FIG. 2(b) shows a moment when the bimetal 24 is deformed due to an increase in temperature and a warp is suddenly reversed and takes a downwardly convex shape (a second shape in the first example). An impact force accompanying the reversal of the bimetal 24 is conveyed to the pressing unit 26a of the spring member 26 through the actuation pin 25 to elastically deform the spring member 26 suddenly. As a result, a hammer 27 provided at a substantially tip portion of the spring member 26 suddenly moves and hits the vibration-driven energy harvesting element 11 from an upper surface. The vibration-driven energy harvesting element 11 is supported by the case 21 via an elastic body 28 including rubber or a spring and vibrates by being hit by the hammer 27.

The vibration-driven energy harvesting element 11 generates electric power using the vibration or sound generated at that time. The generated electric power is input into the rectification circuit 14 shown in FIG. 1 through the connection wirings 12, 13 connected to the outside of the vibration generation unit 20a via an introduction unit 18. Then, the transmission unit 30 of the measurement system 1 shown in FIG. 1 is activated with the electric power generated by the vibration-driven energy harvesting element 11, and the signal including the identification signal unique to the measurement system 1 is transmitted from the antenna 32 to the outside as a radio wave.

Thus, by using the bimetal 24 whose shape suddenly changes (reverses) from the first shape to the second shape at predetermined temperature, the measurement system 1 for transmitting a predetermined signal to the outside can be implemented when the temperature of the environment in which the vibration generation unit 20a is installed changes and substantially rises to the predetermined temperature.

FIG. 2(c) shows a state after the hammer 27 hits the vibration-driven energy harvesting element 11. Due to the elastic force of the spring member 26, the hammer 27 provided in the spring member 26 separates from the vibration-driven energy harvesting element 11.

Then, when the temperature around the vibration generation unit 20a drops, the shape of the bimetal 24 returns to an upwardly convex and warped state as shown in FIG. 2(a).

However, in this case, the hammer 27 provided in the spring member 26 moves upward and does not hit the vibration-driven energy harvesting element 11, and the vibration-driven energy harvesting element 11 does not generate electric power.

By appropriately setting a distance between the hammer 27 and the vibration-driven energy harvesting element 11, the elastic constant of the spring member 26, and the like, the hammer 27 may be configured to hit the vibration-driven energy harvesting element 11 only once when the bimetal 24 is reversed as the temperature rises.

By arranging the bimetal 24 upside down as opposed to the above example, the hammer 27 may be configured to hit the vibration-driven energy harvesting element 11 when the temperature drops so that the vibration-driven energy harvesting element 11 may generate electric power.

Second Example of the Vibration Generation Unit

Figure 3:
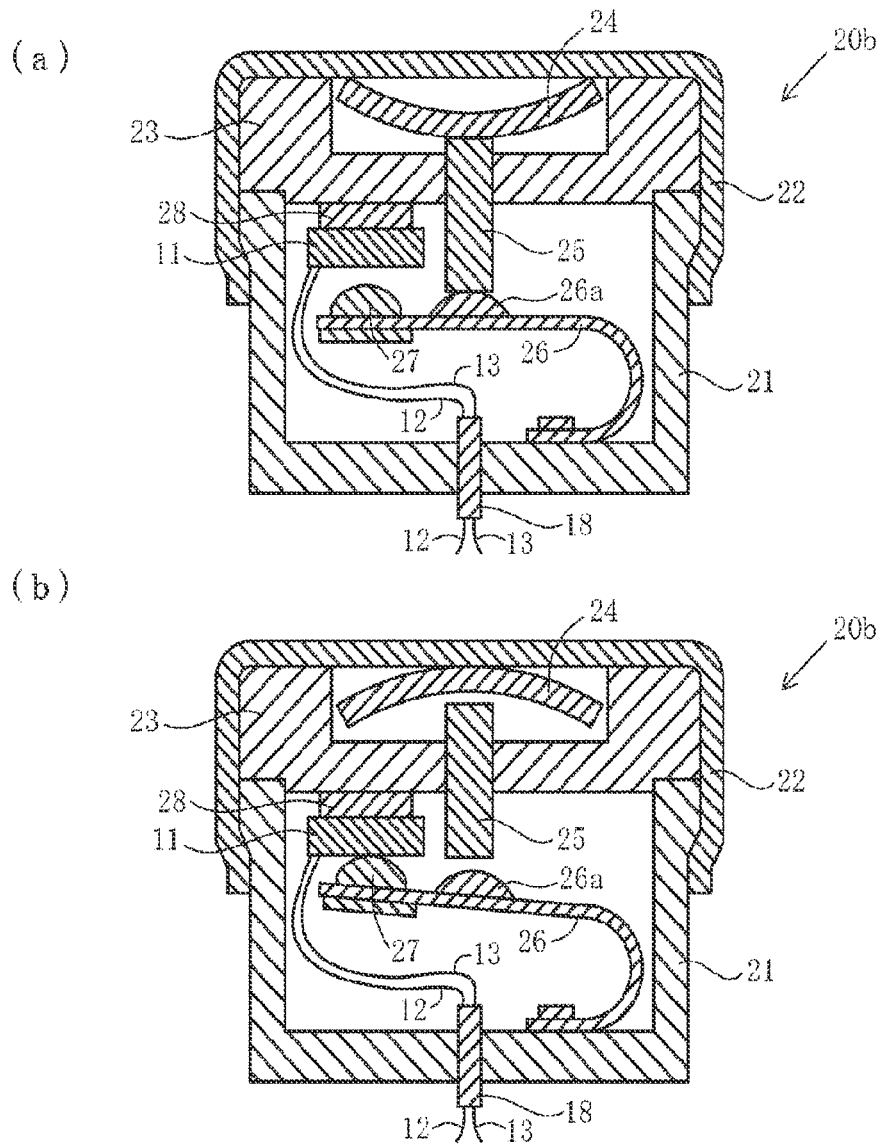
FIG. 3 is a diagram showing a second example of the vibration generation unit.

A vibration generation unit 20b of a second example will be described with reference to FIG. 3. The major portion of the vibration generation unit 20b of the second example is identical to the vibration generation unit 20a of the first example described above. Accordingly, descriptions will be given below of differences from the vibration generation unit 20a of the first example in particular, and descriptions of common configurations will be omitted as appropriate.

FIG. 3(a) shows the vibration generation unit 20b of the second example in a state where the temperature is relatively low. In contrast to the vibration generation unit 20a of the first example, in the vibration generation unit 20b of the second example, the vibration-driven energy harvesting element 11 is supported by the guide 23 via the elastic body 28. Further, the bimetal 24 is warped in a downwardly convex shape (the first shape in the second example) at low temperature. In this state, the pressing unit 26a of the spring member 26 is pushed downward by the bimetal 24 from above via the actuation pin 25.

FIG. 3(b) shows a moment when the bimetal 24 is deformed due to an increase in temperature and a warp is reversed and takes an upwardly convex shape (the second shape in the second example). At this time, since a force for pushing the pressing unit 26a of the spring member 26 downward is released, the hammer 27 provided in the spring member 26 suddenly moves upward due to the elastic force of the spring member 26 and hits the vibration-driven energy harvesting element 11. This generates vibration or sound and the vibration-driven energy harvesting element 11 generates electric power using the vibration or sound.

Then, the transmission unit 30 of the measurement system 1 shown in FIG. 1 is activated using electric power generated by the vibration-driven energy harvesting element 11, and the signal including the identification signal unique to the measurement system 1 is transmitted from the antenna 32 to the outside as a radio wave.

After that, the hammer 27 provided in the spring member 26 separates from the vibration-driven energy harvesting element 11 due to a restoring force of the spring member 26 and rests in a position away from the vibration-driven energy harvesting element 11.

Then, when the temperature around the vibration generation unit 20b drops, the shape of the bimetal 24 returns to a downwardly convex and warped state as shown in FIG. 3(a). At this time, the bimetal 24 suddenly moves the hammer 27 provided in the spring member 26 downward through the actuation pin 25. However, the hammer 27 moves in a direction away from the vibration-driven energy harvesting element 11 and does not hit the vibration-driven energy harvesting element 11, and therefore the vibration-driven energy harvesting element 11 does not generate electric power.

In the vibration generation unit 20b of the second example, the hammer 27 hits the vibration-driven energy harvesting element 11 using the elastic force of the spring member 26, not an impact force itself generated by the bimetal 24 which is suddenly deformed due to a temperature change. Thus, a striking force for hitting the vibration-driven energy harvesting element 11 can be set to a substantially constant magnitude. Accordingly, it is possible to cause the vibration-driven energy harvesting element 11 to generate electric power stably.

Incidentally, also in the vibration generation unit 20b of the second example, by arranging the bimetal 24 upside down as opposed to the above example, the hammer 27 may be configured to hit the vibration-driven energy harvesting element 11 when the temperature drops, so that the vibration-driven energy harvesting element 11 may generate electric power.

Third Example of the Vibration Generation Unit

A vibration generation unit 20c of a third example will be described with reference to FIG. 4. The major portion of the vibration generation unit 20c of the third example is identical to the vibration generation unit 20a of the first example described above. Accordingly, descriptions will be given below of differences from the vibration generation unit 20a of the first example in particular, and descriptions of common configurations will be omitted as appropriate.

Figure 4:
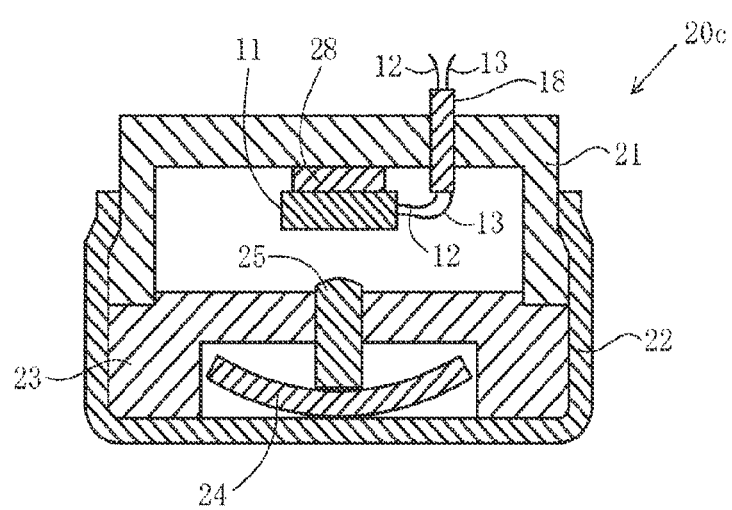
FIG. 4 is a diagram showing a third example of the vibration generation unit.

FIG. 4 shows the vibration generation unit 20c of the third example in a state where the temperature is relatively low. The bimetal 24 in the vibration generation unit 20c of the third example is warped in a downwardly convex shape (the first shape in the third example) at low temperature.

When the temperature around the vibration generation unit 20c rises to predetermined temperature or higher, the bimetal 24 is suddenly deformed into an upwardly convex shape (the first shape in the third example). As a result, the actuation pin 25 is suddenly moved upward by the bimetal 24 and hits the vibration-driven energy harvesting element 11. This generates vibration or sound and the vibration-driven energy harvesting element 11 generates electric power using the vibration or sound.

Since the spring member 26 can be omitted, the configuration of the vibration generation unit 20c of the third example is simple and it is possible to cut down on the cost as compared with the configurations of the vibration generation unit 20a of the first example and the vibration generation unit 20b of the second example.

On the other hand, the configurations of the vibration generation unit 20a of the first example and the vibration generation unit 20b of the second example have an effect that the directions of the vibration generation units 20a and 20b can be arranged regardless of the direction of gravity.

Incidentally, in any of the respective vibration generation units 20a to 20c of the first to third examples, a position where the vibration-driven energy harvesting element 11 is installed is not limited to the inside of the vibration generation units 20a to 20c but may be the vicinities of the vibration generation units 20a to 20c.

In the respective vibration generation units 20a to 20c of the first to third examples, it can be said that the bimetal 24 is a deformation member whose shape suddenly changes from the first shape to the second shape in response to a change in temperature as an environmental state quantity.

Fourth Example of the Vibration Generation Unit

Figure 5:
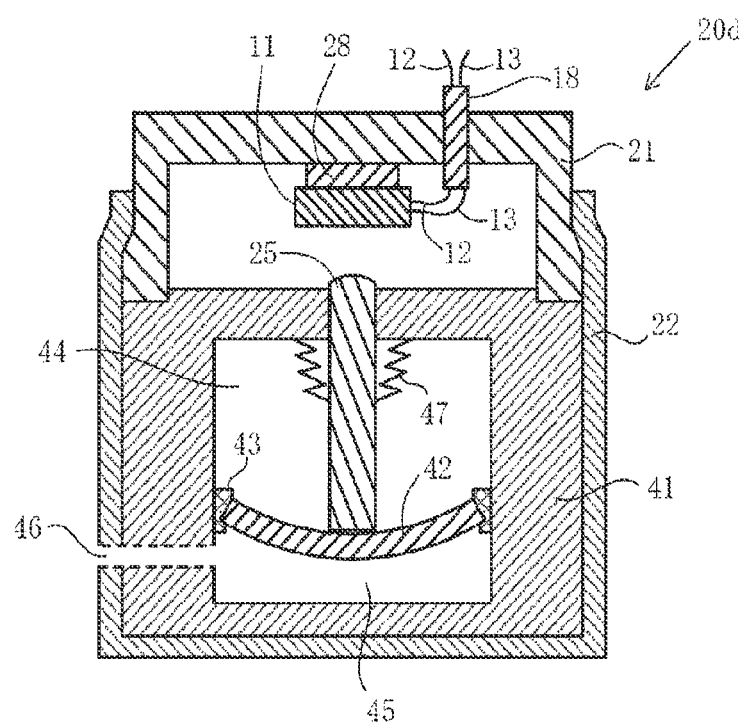
FIG. 5 is a diagram showing a fourth example of the vibration generation unit.

A vibration generation unit 20d of a fourth example will be described with reference to FIG. 5. The vibration generation unit 20d of the fourth example has many portions in common with the vibration generation unit 20c of the third example described above. Thus, descriptions will be given below of differences from the vibration generation unit 20c of the third example in particular, and descriptions of common configurations will be omitted as appropriate.

The vibration generation unit 20d of the fourth example generates sound or vibration according to pressure which is an example of the environmental state quantity. As in the case of the vibration generation unit 20c of the third example, the vibration generation unit 20d has a housing including the case 21, the cap 22, a guide 41, and the like and has the vibration-driven energy harvesting element 11 and a pressure bulkhead 42 in the housing.

The pressure bulkhead 42 is provided as a bulkhead between airtight space 44 and open space 45 formed by the guide 41 and the airtight space 44 is made airtight with respect to the open space 45 by the pressure bulkhead 42 and a support unit 43. On the other hand, the open space 45 is connected to the outside through a ventilation hole 46, and pressure inside the open space 45 is the same as external pressure (atmospheric pressure).

The pressure bulkhead 42 is, as an example, a metal plate with relatively high rigidity and has a concave shape with respect to an airtight space 44 side due to a pressure difference between gas in the airtight space 44 and gas in the open space 45. The actuation pin 25 is arranged on the pressure bulkhead 42 and is arranged so that the upper end of the actuation pin 25 faces the vibration-driven energy harvesting element 11 via a through hole provided in the guide 41. A vacuum bellows 47 is provided between the actuation pin 25 and the guide 41 to keep airtightness between the actuation pin 25 and the guide 41.

Incidentally, in a case where the airtightness between the actuation pin 25 and the guide 41 is sufficiently kept, the vacuum bellows 47 does not need to be provided.

When the atmospheric pressure rises above a predetermined value, the pressure in the open space 45 rises and the pressure bulkhead 42 is suddenly deformed so as to be in a convex shape with respect to the airtight space 44 side.

This deformation pushes the actuation pin 25 upward and causes the actuation pin 25 to collide with the vibration-driven energy harvesting element 11, and the vibration-driven energy harvesting element 11 vibrates.

On the other hand, when the atmospheric pressure drops, the pressure in the open space 45 also drops, and when the difference between the pressure in the open space 45 and the pressure in the airtight space 44 becomes a predetermined value or more, the pressure bulkhead 42 is deformed into the original concave shape with respect to the airtight space 44 side.

Incidentally, the vibration generation unit 20d of the fourth example is not necessarily limited to the configuration of generating sound in response to the change in atmospheric pressure described above but can be configured to generate sound according to atmospheric pressure and hydraulic pressure (water pressure) inside an object to be measured. This only requires, for example, introducing gas or liquid inside the object to be measured into the open space 45 through the ventilation hole 46.

In the vibration generation unit 20d of the fourth example, the pressure bulkhead 42 can be said to be a deformation member whose shape suddenly changes from the first shape to the second shape in response to a change in pressure as an environmental state quantity.

Fifth Example of the Vibration Generation Unit

A vibration generation unit 20e of a fifth example will be described with reference to FIG. 6. The vibration generation unit 20e of the fifth example has many portions in common with the vibration generation unit 20c of the third example described above. Accordingly, descriptions will be given below of differences from the vibration generation unit 20c of the third example in particular, and descriptions of common configurations will be omitted as appropriate.

The vibration generation unit 20e of the fifth example generates sound or vibration according to flow rate which is an example of an environmental state quantity. As is the case with the vibration generation unit 20c of the third example, the vibration generation unit 20e has a housing including the case 21, a guide 51, and the like and has the vibration-driven energy harvesting element 11 and a variation unit 52 in the housing. The variation unit 52 is, as an example, a metal plate with relatively high rigidity and has a concave curved surface shape with respect to the actuation pin 25. An end of the variation unit 52 is fixed to an inner wall of the guide 51 by a support unit 53.

A lower end of the guide 51 is fixed to a side surface of a pipe 60. A substantially L-shaped paddle 54 is rotatably inserted into the pipe 60 using a fulcrum 56 as a rotary shaft. A first portion 54a of the paddle 54 is inside the pipe 60, and a second portion 54b of the paddle 54 is outside the pipe 60 and is arranged such that a pressing unit 55 provided on the second portion 54b faces the variation unit 52.

Figure 6:
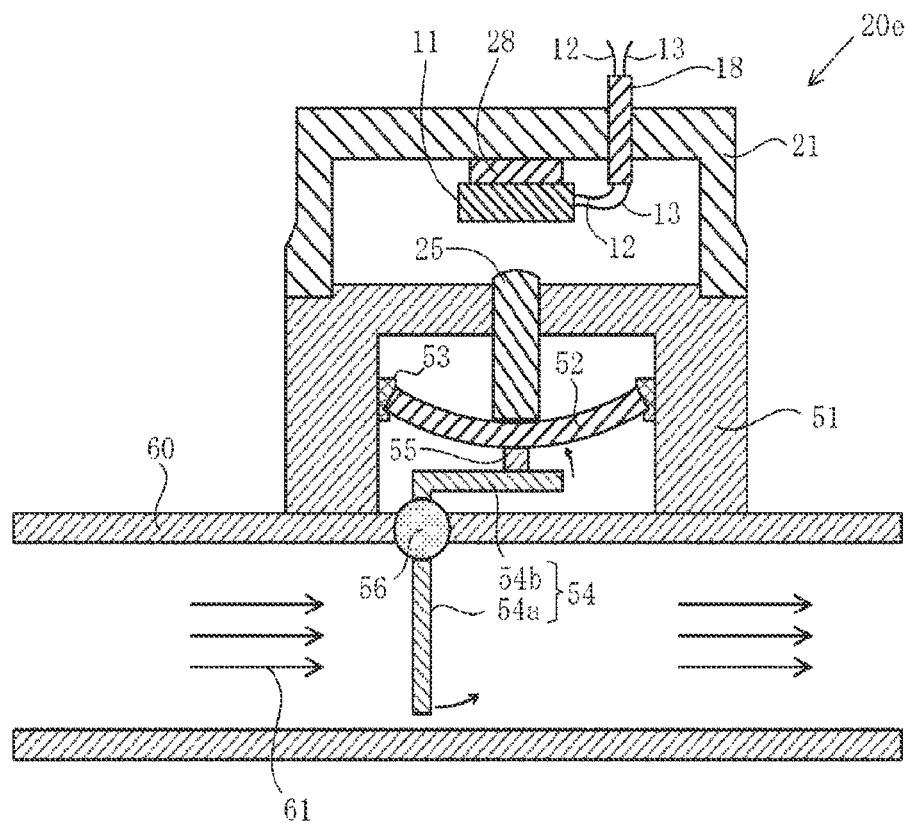
FIG. 6 is a diagram showing a fifth example of the vibration generation unit.

As shown in FIG. 6, when a fluid 61 flows inside the pipe 60 in a direction indicated by arrows, a force for rotating the paddle 54 counterclockwise using the fulcrum 56 as a rotary shaft is applied to the first portion 54a of the paddle 54. This force is conveyed to the second portion 54b of the paddle 54, and the pressing unit 55 provided on the second portion 54b pushes the variation unit 52 upward.

When the flow rate of the fluid 61 flowing inside the pipe 60 becomes a predetermined value or higher, a force with which the pressing unit 55 pushes the variation unit 52 upward becomes larger, and the variation unit 52 is suddenly deformed so that the shape of the variation unit 52 is a convex shape with respect to the actuation pin 25.

This deformation pushes the actuation pin 25 upward and causes the actuation pin 25 to collide with the vibration-driven energy harvesting element 11, and the vibration-driven energy harvesting element 11 vibrates.

On the other hand, when the flow rate of the fluid 61 flowing inside the pipe 60 becomes less than a predetermined value, the force with which the pressing unit 55 pushes the variation unit 52 upward becomes smaller, and the variation unit 52 is returned to the original shape which is a concave shape with respect to the actuation pin 25 due to the weight of the actuation pin 25 or the like.

In the vibration generation unit 20e of the fifth example, it can be said that the paddle 54 is a displacement unit in which the position of the second portion 54b changes in response to a change in flow rate. It can also be said that the variation unit 52 is a deformation member whose shape suddenly changes from the first shape to the second shape according to the position of the paddle 54 (displacement unit).

In the respective vibration generation units 20a to 20e of the first to fifth examples described above, a sudden change in the shapes of the bimetal 24, the pressure bulkhead 42, and the variation unit 52 moves the actuation pin 25, and the vibration-driven energy harvesting element 11 generates electric power using vibration generated by the collision of the actuation pin 25 with the vibration-driven energy harvesting element 11. However, the vibration-driven energy harvesting element 11 may generate electric power using sound generated when the bimetal 24, the pressure bulkhead 42, and the variation unit 52 are suddenly deformed without providing the actuation pin 25.

Sixth Example of the Vibration Generation Unit

A vibration generation unit 20f of a sixth example will be described with reference to FIG. 7. The vibration generation unit 20f of the sixth example has many portions in common with the vibration generation unit 20d of the fourth example described above. Accordingly, descriptions will be given below of differences from the vibration generation unit 20d of the fourth example in particular, and descriptions of common configurations will be omitted as appropriate.

As in the case of the vibration generation unit 20d of the fourth example, the vibration generation unit 20f of the sixth example also generates sound or vibration according to pressure which is an example of an environmental state quantity. The vibration generation unit 20f has a housing including the case 21, the guide 41, and the like and has the vibration-driven energy harvesting element 11 and a movable plate 49 in the housing. An upper surface 41T of the guide 41 is inclined with respect to a horizontal plane, and a sphere 57 is placed on the upper surface 41T.

The vibration-driven energy harvesting element 11 is arranged via the elastic body 28 on the floor surface of the case 21 in the vicinity of the lower side of the inclined upper surface 41T. As will be described later, the vibration-driven energy harvesting element 11 is arranged in a position where the sphere 57 rolled down from the upper surface 41T falls.

The movable plate 49 is provided as a bulkhead between the airtight space 44 and the open space 45 formed by the guide 41, and the airtight space 44 is made airtight with respect to the open space 45 by the movable plate 49 and the support unit 43 and, as an example, is kept at atmospheric pressure higher than 1 atm. On the other hand, the open space 45 is connected to the outside through the ventilation hole 46 and the pressure inside the open space 45 is the same as the external pressure (atmospheric pressure).

The movable plate 49 is, as an example, a metal plate which has relatively low rigidity and is deformed according to a pressure difference between the airtight space 44 and the open space 45. The actuation pin 25 is arranged on the movable plate 49, and an upper end 25T of the actuation pin 25 projects onto the upper surface 41T of the guide 41 through the through hole provided in the guide 41. The upper end 25T of the actuation pin 25 prevents the sphere 57 from rolling down the upper surface 41T.

In the vibration generation unit 20f, a vacuum bellows 47 is provided between the actuation pin 25 and the guide 41 so that the pressure in the open space 45 is not conveyed to the space in which the vibration-driven energy harvesting element 11 is arranged.

Incidentally, in a case where the airtightness between the actuation pin 25 and the guide 41 is sufficiently kept, the vacuum bellows 47 does not need to be provided.

When the external pressure (atmospheric pressure) rises, the atmospheric pressure in the open space 45 increases, and the movable plate 49 is gradually deformed and pushed downward. Thus, the position of the upper end 25T of the actuation pin 25 also gradually moves downward. Then, when the external pressure reaches predetermined pressure, the sphere 57 rolls down the upper surface 41T without being held by the upper end 25T of the actuation pin 25, becomes a sphere 57f shown by a broken line, and falls on the vibration-driven energy harvesting element 11.

The fall of the sphere 57f generates vibration in the vibration-driven energy harvesting element 11, and sound is also generated accordingly. Thus, even in the vibration generation unit 20f of the sixth example, sound or vibration is generated in response to a change in pressure which is an environmental state quantity. Further, the vibration-driven energy harvesting element 11 generates electric power using the sound or vibration generated by the fall of the sphere 57f.

Incidentally, the vibration-driven energy harvesting element 11 may be covered with a resonance plate (not shown) made of metal or the like and may be caused to generate electric power using sound generated from the resonance plate when the sphere 57f is dropped on the resonance plate.

It should be noted that as in the case of the vibration generation unit 20d of the fourth example described above, sound may be generated according to the atmospheric pressure and hydraulic pressure (water pressure) inside the object to be measured also in the vibration generation unit 20f of the sixth example.

The vibration generation unit 20f of the sixth example described above uses the movable plate 49 that gradually deforms (displaces) in response to a change in pressure.

However, the movable plate 49 is not limited to this configuration but, for example, may be made of relatively low-rigidity bimetal whose shape gradually changes with a temperature change. In this case, as an example, the movable plate 49 made of bimetal has an upwardly convex shape at low temperature as shown in FIG. 7 and gradually changes into a downwardly convex shape as the temperature rises, and the position of the upper end 25T of the actuation pin 25 is gradually lowered. Then, the sphere 57 rolls down the upper surface 41T without being held by the upper end 25T of the actuation pin 25 at predetermined temperature, so that the vibration generation unit 20f generates sound or vibration in response to a change in temperature which is an environmental state quantity.

One side of the movable plate 49 with relatively low rigidity may be pushed by the second portion 54b of the paddle 54 as included in the vibration generation unit 20e of the fifth example described above. This configuration can cause the vibration generation unit 20f to generate sound or vibration in response to a change in flow rate which is an environmental state quantity.

Effect of the Measurement System of the First Embodiment (1) The measurement system 1 of the first embodiment described above includes the vibration generation units 20, 20a to 20f that generate sound or vibration in response to a change in environmental state quantity, the vibration-driven energy harvesting unit 10 that generates electric power using the sound or vibration generated by the vibration generation units 20, 20a to 20f, and the transmission unit 30 that is driven with the electric power generated by the vibration-driven energy harvesting unit 10 and transmits predetermined information.

This configuration enables driving the transmission unit 30 with the electric power generated by the vibration-driven energy harvesting unit 10 using the sound or vibration generated by the vibration generation units 20, 20a to 20f to implement the measurement system 1 in which power consumption is significantly reduced. Thus, it is possible to implement the measurement system 1 in which maintenance on wiring of a power line and a power supply such as battery replacement is unnecessary and an installation cost and a maintenance cost are low.

(2) The vibration generation units 20, 20a to 20e may include deformation members (the bimetal 24, the pressure bulkhead 42, and the variation unit 52) whose shapes rapidly change from the first shape to the second shape in response to a change in environmental state quantity. In this case, since the vibration generation units 20, 20a to 20e can generate a certain level or more of volume or vibration energy with the deformation member, the vibration-driven energy harvesting unit 10 can generate electric power sufficient for transmission from the transmission unit 30.

(3) In a case where the environmental state quantity is temperature, the deformation member may be the bimetal 24 whose shape suddenly changes in response to a change in temperature. As a result, it is possible to transmit from the transmission unit 30 the fact that the temperature of the environment has reached predetermined temperature.

(4) In a case where the environmental state quantity is pressure, the deformation member may be the pressure bulkhead 42 whose shape suddenly changes in response to a change in pressure. As a result, it is possible to transmit from the transmission unit 30 the fact that the pressure of the environment has reached predetermined pressure.

(5) In a case where the environmental state quantity is flow rate, the vibration generation unit 20e may further include the displacement unit (paddle 54) at least a portion of which changes in position in response to a change in flow rate, and the shape of the deformation member (variation unit 52) may suddenly change according to the position of the displacement unit. As a result, it is possible to transmit from the transmission unit 30 the fact that the flow rate which is an environmental state quantity measured by the measurement system 1 has reached predetermined flow rate.

(6) The transmission unit 30 may be a wireless transmission unit that performs transmission wirelessly. In this case, information on a change in environmental state quantity can be transmitted to a remote location without providing a wired signal line.

(7) The transmission unit 30 may be configured to perform transmission when electric power generated by the vibration-driven energy harvesting unit 10 exceeds the first voltage and not to perform transmission when the electric power generated by the vibration-driven energy harvesting unit 10 is less than or equal to the first voltage. This configuration reduces a possibility that the transmission unit 30 may malfunction due to electric power generated by the vibration-driven energy harvesting unit 10 using sound or vibration other than sound or vibration generated by the vibration generation units 20, 20a to 20f, that is, sound or vibration existing in the environment. That is, there is reduced a possibility that the measurement system 1 may give a false alarm.

Measurement System of a Second Embodiment

Figure 8:
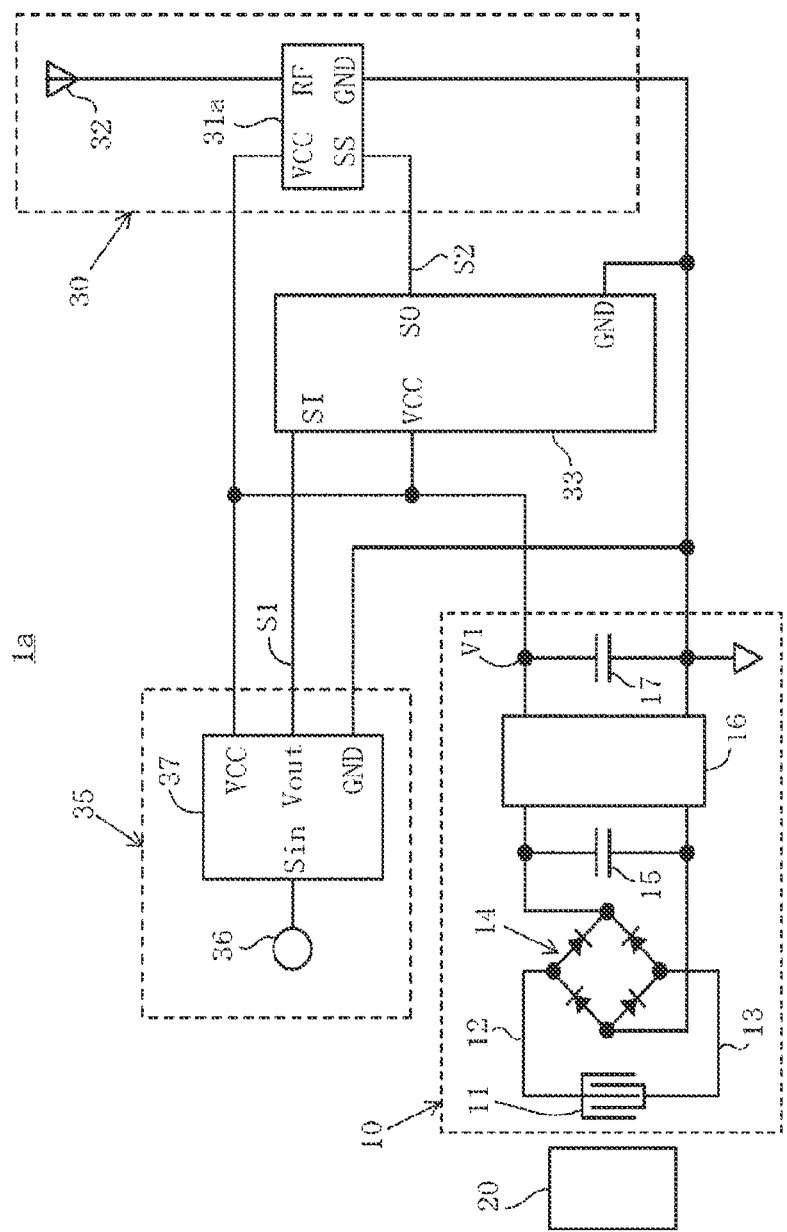
FIG. 8 is a diagram showing a schematic configuration of a measurement system of a second embodiment.

A measurement system 1a of a second embodiment will be described below with reference to FIG. 8. The measurement system 1a of the second embodiment includes, in addition to the configuration of the measurement system 1 of the first embodiment described above, a detection unit 35 that detects an environmental state quantity such as temperature, pressure, and flow rate and a signal processing unit 33 that processes a signal relating to the environmental state quantity detected by the detection unit 35. The transmission unit 30, the signal processing unit 33, and the detection unit 35 are driven when the voltage of the electric power supplied from the vibration-driven energy harvesting unit 10 becomes higher than the first voltage described above.

The detection unit 35 has a sensor 36 that detects temperature, pressure, flow rate, and the like which are environmental state quantities in the environment where the measurement system 1a is installed, and a detection circuit 37. In a case where the detection unit 35 detects temperature, the sensor 36 includes a thermistor, a thermocouple, or the like; in a case where the detection unit 35 detects pressure, the sensor 36 includes a pressure sensor, a pressure transducer, or the like; and in a case where the detection unit 35 detects flow rate, the sensor 36 includes a vortex flow sensor, an electromagnetic flow meter, and the like.

As an example, the detection circuit 37 is a circuit including an amplifier element such as a transistor or a differential amplifier. The detection circuit 37 receives from a Sin terminal an analog signal output from the sensor 36, performs processing such as amplification of the received signal, and outputs the processed analog signal as a first signal S1 from a Vout terminal. The electric power output from the power storage unit 17 of the vibration-driven energy harvesting unit 10 is supplied to the VCC terminal in the detection circuit 37, and the GND terminal in the detection circuit 37 is connected to the ground.

As an example, the signal processing unit 33 is a semiconductor integrated circuit such as a microcontroller that includes an analog/digital converter and performs predetermined signal processing of a converted digital signal. An input terminal SI in the signal processing unit 33 is connected to the Vout terminal in the detection circuit 37 and the first signal S1 output from the Vout terminal in the detection circuit 37 is input into the input terminal SI in the signal processing unit 33. The electric power output from the power storage unit 17 of the vibration-driven energy harvesting unit 10 is supplied to the VCC terminal in the signal processing unit 33 and the GND terminal in the signal processing unit 33 is connected to the ground.

The first signal S1 input into the input terminal SI in the signal processing unit 33 is converted (A/D-converted) from an analog signal to a digital signal in the signal processing unit 33. Further, based on the first signal A/D-converted in the signal processing unit 33, signal processing is performed to calculate numerical information on the environmental state quantity such as temperature, pressure, and flow rate detected by the sensor 36. The numerical information extracted from the first signal S1 by signal processing is output as a digital second signal S2 from an output terminal SO in the signal processing unit 33.

The signal processing unit 33 performs the signal processing described above according to a program stored in a ROM (not shown) or the like.

Incidentally, the signal processing also includes the processing of A/D-converting of the analog first signal S1 into the digital second signal S2. Thus, the second signal S2 may be a signal obtained by simply A/D-converting the first signal S1.

An input terminal SS in the communication circuit 31a is connected to the output terminal SO in the signal processing unit 33, and the second signal S2 output from the output terminal SO in the signal processing unit 33 is input into the input terminal SS. The communication circuit 31a is basically the same as the communication circuit 31 in the first embodiment described above. However, the communication circuit 31a further has the function of modulating the second signal S2 input from the input terminal SS as a modulation signal suitable for wireless transmission from the antenna 32 to perform amplification and output the amplified modulation signal from the RF terminal to the antenna 32. The modulation signal modulated based on the second signal is transmitted from the antenna 32 to the outside.

Incidentally, in a case where the numerical information on the environmental state quantity extracted from the first signal S1 by the signal processing is within a predetermined normal range, the signal processing unit 33 may transmit to the communication circuit 31a a signal for conveying unnecessariness of transmission instead of the second signal S2. The communication circuit 31a that has received the signal for conveying the unnecessariness of transmission does not perform transmission to the outside.

Also in the measurement system 1a of the second embodiment, in addition to the signal based on the information detected by the detection unit 35, an identification signal unique to the measurement system 1a may be transmitted from the antenna 32 to the outside as in the measurement system 1 of the first embodiment described above.

Incidentally, the detection unit 35 is not limited to one that detects an environmental state quantity such as temperature, pressure, and flow rate but may be, for example, one that captures surrounding conditions of the measurement system 1a as an image or may be one that detects ambient sound. Accordingly, the signal processing unit 33 and the transmission unit 30 each may also process and transmit an image signal or an audio signal.

Effect of the Measurement System of the Second Embodiment (8) The measurement system 1a of the second embodiment further includes, in addition to the measurement system 1 of the first embodiment described above, the detection unit 35 that is driven with the electric power generated by the vibration-driven energy harvesting unit 10 and performs predetermined detection, the transmission unit 30 transmitting information based on information obtained by performing, by the detection unit 35, the predetermined detection. This configuration produces an effect that the detection unit 35 enables detecting and transmitting more accurate information in addition to the effect in the measurement system 1 of the first embodiment described above.

Diagnosis System of One Embodiment

Figure 9:
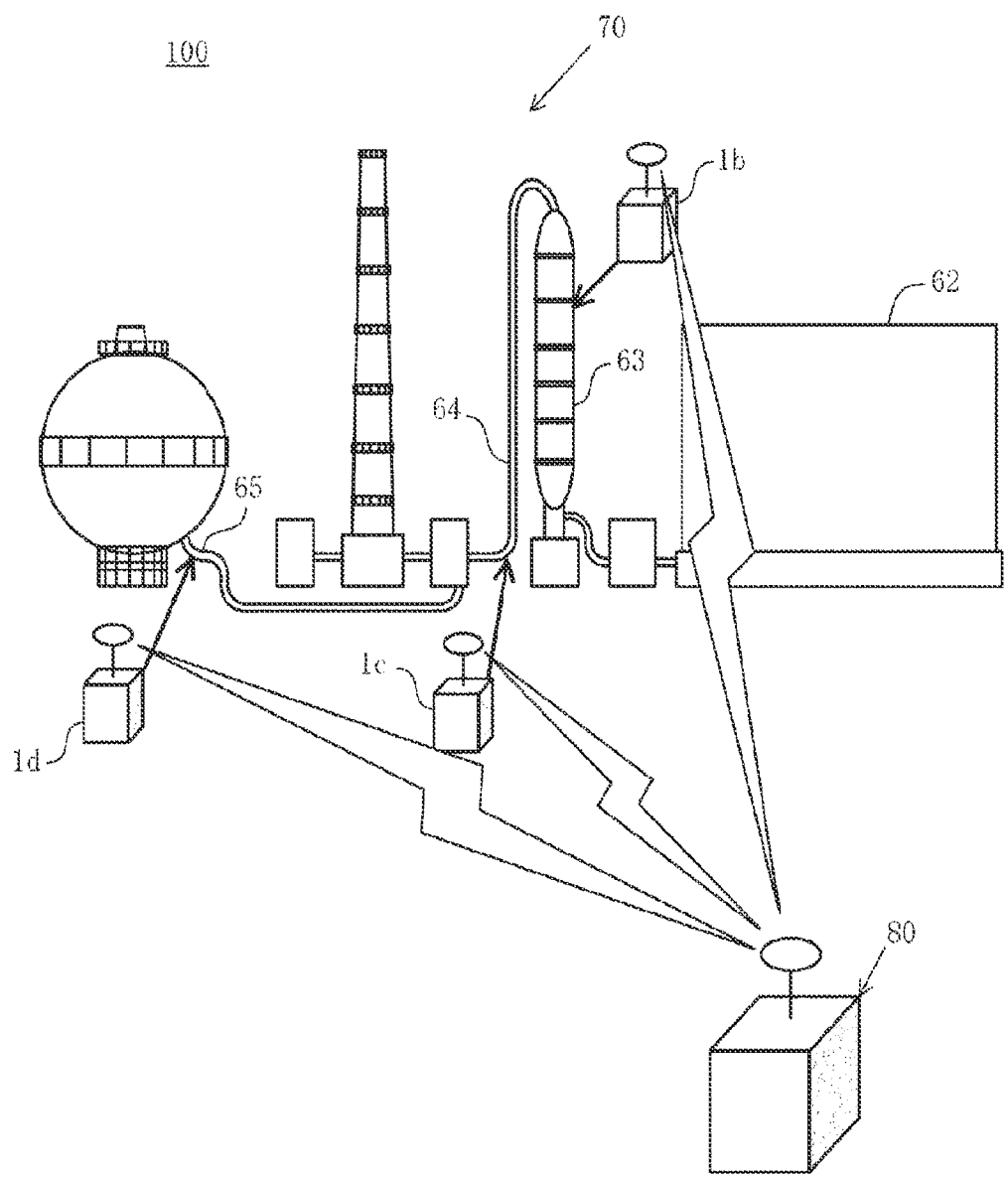
FIG. 9 is a diagram showing a schematic configuration of one embodiment of a diagnosis system.

FIG. 9 is a diagram showing a schematic configuration of a diagnosis system 100 of one embodiment. As an example, the diagnosis system 100 is a system for diagnosing the operation state of a chemical plant 70 as an object to be diagnosed. In the diagnosis system 100, in order to measure the environmental state quantity of each portion in the chemical plant 70, the measurement system 1 of the first embodiment or the measurement system 1a of the second embodiment described above is arranged in the vicinity of each portion in the chemical plant 70.

In the chemical plant 70, a crude oil tank 62, pipes (64, 65, and the like), and the like are arranged in a complicated and dense manner, and a highly flammable raw material such as petroleum or high-pressure gas is used. Thus, it is difficult to arrange a measurement system that always uses electric power in the chemical plant 70. However, the measurement systems 1 and 1a of the first embodiment and the second embodiment described above do not require wiring for supplying electric power or maintenance of a power supply such as a battery and thus are suitable for measuring complicated equipment such as the chemical plant 70.

A measurement system 1b is installed in a location indicated by an arrow in FIG. 9 in a distillation column 63 of the chemical plant 70. The measurement system 1b is the measurement system 1 described above and includes any one of the vibration generation units 20a to 20c that generates sound or vibration in response to a change in temperature as an environmental state quantity. The vibration generation units 20a to 20c in the measurement system 1b are arranged in contact with the side surface of the distillation column 63 or arranged such that at least a portion of the vibration generation units 20a to 20c is embedded within the distillation column 63.

When the temperature of the side surface or inside of the distillation column 63 becomes predetermined temperature or higher, the vibration generation units 20a to 20c included in the measurement system 1b generate sound or vibration. Then, the vibration-driven energy harvesting unit 10 included in the measurement system 1b generates electric power using this sound or vibration, and a signal including the identification signal of the measurement system 1b is wirelessly transmitted from the transmission unit 30.

A measurement system 1c is installed in a location indicated by an arrow in FIG. 9 in the pipe 64 of the chemical plant 70. The measurement system 1c is the measurement system 1 described above and includes the vibration generation unit 20e that generates sound or vibration in response to a change in flow rate as an environmental state quantity. When the flow rate of liquid or gas flowing inside the pipe 64 becomes predetermined flow rate or higher, the vibration generation unit 20e included in the measurement system 1c generates sound or vibration. Then, the vibration-driven energy harvesting unit 10 included in the measurement system 1c generates electric power using this sound or vibration, and a signal including the identification signal of the measurement system 1c is wirelessly transmitted from the transmission unit 30.

A measurement system 1d is installed in a location indicated by an arrow in FIG. 9 in the pipe 65 of the chemical plant 70. The measurement system 1d is the measurement system 1 described above and includes the vibration generation unit 20d that generates sound or vibration in response to a change in pressure as an environmental state quantity. The vibration generation unit 20d is arranged such that at least a portion of the vibration generation unit 20d of the measurement system 1d is embedded in the pipe 65.

When the pressure of liquid or gas inside the pipe 65 becomes predetermined pressure or higher, the vibration generation unit 20d included in the measurement system 1d generates sound or vibration. Then, the vibration-driven energy harvesting unit 10 included in the measurement system 1d generates electric power using this sound or vibration, and a signal including the identification signal of the measurement system 1d is wirelessly transmitted from the transmission unit 30.

The signals transmitted wirelessly by the measurement systems 1b to 1d are received by a reception system 80. The reception system 80 is supplied with electric power, for example, from a commercial power supply or the like, and is always kept in a state where the signals from the measurement systems 1b to 1d can be received. The reception system 80 can recognize from which of the measurement systems 1b to 1d a signal is transmitted by recognizing the above-described identification signal included in the signal transmitted wirelessly by the measurement systems 1b to 1d. Consequently, the reception system 80 can diagnose which of the measurement systems 1b to 1d measures an environmental state quantity that has reached a level at which an alarm is issued.

Figure 7:
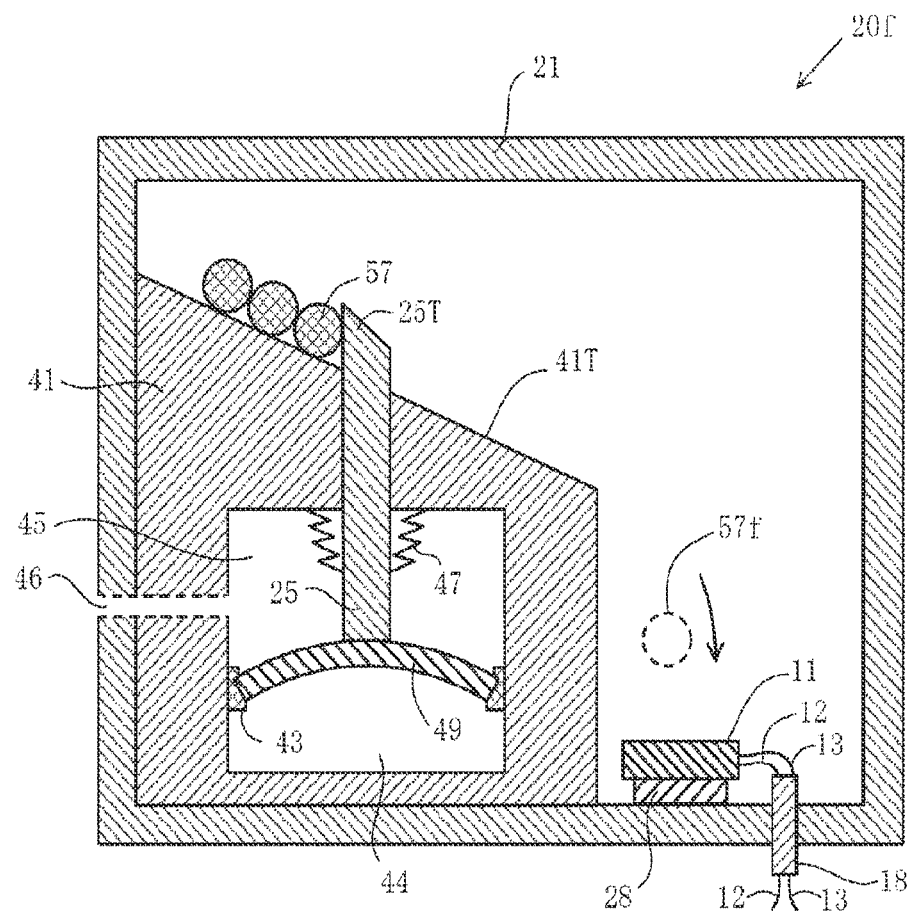
FIG. 7 is a diagram showing a sixth example of the vibration generation unit.

Incidentally, as the measurement systems 1b to 1d, the measurement system 1 of the first embodiment including the above-described vibration generation unit 20f of the sixth example shown in FIG. 7 may be used. In this case, the vibration generation unit 20f may generate sound or vibration in response to a change in any one of temperature, pressure, and flow rate as described above.

Further, the measurement systems 1b to 1d are not limited to the measurement system 1 of the first embodiment described above, and the measurement system 1a of the second embodiment described above may also be used. In this case, the reception system 80 may also receive a signal transmitted from the measurement system 1a and based on the information detected by the detection unit 35 of the measurement system 1a.

In the one embodiment described above, the object to be diagnosed by the diagnosis system 100 is equipment constituting the chemical plant 70, but the object to be diagnosed is not limited to this. The diagnosis system 100 may diagnose any object as long as the object is one for which an environmental state quantity such as temperature, pressure, and flow rate needs to be diagnosed. For example, air conditioner equipment in a large building, exhaust equipment in a factory, combustion equipment such as a boiler, and the like may be the objects to be diagnosed.

Incidentally, in the case of diagnosing equipment in which a highly flammable raw material is used, such as the chemical plant 70, at least a portion of the vibration generation units 20, 20a to 20f included in the measurement systems 1, 1a may be manufactured of a material (metal such as copper, brass, and aluminum or ceramic or the like) which does not throw sparks due to impact at the time of generating sound or vibration. Alternatively, it may be manufactured of a metal material other than the above, and portions in contact with each other may be covered with a protective film such as resin. That is, the measurement systems 1b to 1d may satisfy the explosion-proof standard.

Incidentally, in the diagnosis system 100, transmission from the measurement systems 1b to 1d to the reception system 80 may be performed via a line such as a telephone line or an internet line. That is, the signals transmitted from the measurement systems 1b to 1d may be received by a relay station first and then transmitted from the relay station to the reception system 80 via the line.

Effect of the Diagnosis System of One Embodiment (9) The diagnosis system 100 of one embodiment includes the measurement systems 1b to 1d of the first embodiment or the second embodiment arranged in the vicinities of objects to be diagnosed (62, 63, 64) and a reception system that receives a signal transmitted from the measurement systems 1b to 1d and diagnoses the states of the objects to be diagnosed (62, 63, 64) based on the signal. Therefore, using the measurement systems 1b to 1d in which power consumption is significantly reduced eliminates the need for maintenance on the measurement systems 1b to 1d relating to wiring of a power line and a power supply such as battery replacement and can implement the diagnosis system 100 with low installation and maintenance costs.

Although various embodiments and modifications have been described above, the present invention is not limited to these contents. Additionally, each embodiment and modification may be applied individually or may be used in combination. The other aspects conceivable within the scope of the technical idea of the present invention are also included within the scope of the present invention.

The disclosure contents of the following priority basic application are incorporated herein as citations. Japanese Patent Application No. 2020-011202 (filed on Jan. 27, 2020).

REFERENCE SIGNS LIST 1, 1a-1d measurement system
10 vibration-driven energy harvesting unit
11 vibration-driven energy harvesting element
12, 13 connection wiring
14 rectification circuit
15 capacitor
16 voltage converter
17 power storage unit
20, 20a to 20f vibration generation unit
24 bimetal (deformation member)
30 transmission unit
31, 31a communication circuit
32 antenna
35 detection unit
36 sensor
37 detection circuit
33 signal processing unit
42 pressure bulkhead (deformation member)
52 variation unit (deformation member)
54 paddle (displacement unit)
70 chemical plant (object)
80 reception system
100 diagnosis system

The invention claimed is:
1. A measurement system comprising:
a vibration generation unit that generates sound or vibration in response to a change in an environmental state quantity;
a vibration-driven energy harvesting unit that generates electric power using the sound or vibration generated by the vibration generation unit, wherein the vibration generation unit includes a structure configured to impact the vibration-driven energy harvesting unit to generate the sound or vibration,
wherein the vibration generation unit includes a deformation member whose shape suddenly changes from a first shape to a second shape in response to the change in the environmental state quantity,
wherein the environmental state quantity is pressure and the deformation member is a pressure bulkhead whose shape suddenly changes in response to a change in pressure; and
a transmission unit that is driven with the electric power generated by the vibration-driven energy harvesting unit and transmits a transmission that includes predetermined information.
2. The measurement system according to claim 1 wherein the transmission unit is a wireless transmission unit that performs the transmission wirelessly.

3. The measurement system according to claim 1, wherein the transmission unit performs the transmission when the electric power generated by the vibration-driven energy harvesting unit exceeds a first voltage and does not perform the transmission when the electric power generated by the vibration-driven energy harvesting unit is less than or equal to the first voltage.

4. The measurement system according to claim 3, wherein the transmission unit is a wireless transmission unit that performs the transmission wirelessly.

5. The measurement system according to claim 1, further comprising:
- a detection unit that is driven with the electric power generated by the vibration-driven energy harvesting unit and performs predetermined detection,
- wherein the transmission unit transmits information based on information obtained by performing, by the detection unit, the predetermined detection.

6. The measurement system according to claim 5, wherein the transmission unit is a wireless transmission unit that performs the transmission wirelessly.

7. The measurement system according to claim 5, wherein the detection unit detects information on the environmental state quantity.

8. The measurement system according to claim 7, wherein the transmission unit is a wireless transmission unit that performs the transmission wirelessly.

9. A diagnosis system comprising:
- the measurement system according to claim 1, the measurement system being arranged near an object to be diagnosed; and
- a reception system that receives a signal transmitted from the measurement system to diagnose a state of the object to be diagnosed based on the signal.

10. The measurement system of claim 1, wherein the structure configured to impact the vibration-driven energy harvesting unit comprises a hammer, a pin, or a sphere.

11. A measurement system comprising:
- a vibration generation unit that generates sound or vibration in response to a change in an environmental state quantity;
- a vibration-driven energy harvesting unit that generates electric power using the sound or vibration generated by the vibration generation unit, wherein the vibration generation unit includes a structure configured to impact the vibration-driven energy harvesting unit to generate the sound or vibration,
- wherein the vibration generation unit includes a deformation member whose shape suddenly changes from a first shape to a second shape in response to the change in the environmental state quantity, and
- wherein the environmental state quantity is a flow rate;
- wherein the vibration generation unit further includes a displacement unit, a position of at least a portion of the displacement unit changing in response to a change in the flow rate;
- the deformation member suddenly changes in shape according to the position of at least the portion of the displacement unit; and
- a transmission unit that is driven with the electric power generated by the vibration-driven energy harvesting unit and transmits a transmission that includes predetermined information.

* * * * *